Sept. 14, 1965 J. A. SCARONI, JR 3,206,617

CONSTANT INPUT-IMPEDANCE LIMITER CIRCUIT

Filed Feb. 21, 1963 2 Sheets-Sheet 1

INVENTOR.
Joseph A. Scaroni Jr.
BY
C. A. Gulbrandsen
ATTY.

Sept. 14, 1965 J. A. SCARONI, JR 3,206,617

CONSTANT INPUT-IMPEDANCE LIMITER CIRCUIT

Filed Feb. 21, 1963 2 Sheets-Sheet 2

INVENTOR.
Joseph A. Scaroni Jr.

BY

C. A. Gulbrandsen

ATTY.

3,206,617
CONSTANT INPUT-IMPEDANCE LIMITER CIRCUIT

Joseph A. Scaroni, Jr., Menlo Park, Calif., assignor, by mesne assignments, to Automatic Electric Laboratories, Inc., Northlake, Ill., a corporation of Delaware Filed Feb. 21, 1963, Ser. No. 260,163
2 Claims. (Cl. 307—88.5)

This invention relates to a limiter circuit, and more particularly to a device that removes the amplitude modulated components from a frequency modulated signal. The frequency-modulated signal is limited prior to discrimination for the purpose of eliminating any amplitude modulation or noise carried with the signal. The type of system in which the limiter circuit may be incorporated is shown in the article "The New Microwave," Parts I and II, The Lenkurt Demodulator, vol. 10, September, October 1961.

In the past, limiter circuits were developed for use with electron tube circuitry. The limiters in some cases used the amplifying tube as the limiter, and in other cases diodes were used following the amplifier. Both shunt and series diode limiter configurations have been used separately. For the shunt diode limiter a high input source impedance is required and is readily obtainable using a pentode electron tube. The impedance of the shunt diode limiter decreases with increased limiting. For the series diode limiter a low input source-impedance is required and the impedance of the limiter increases with limiting action. All prior-art limiters have suffered from this fundamental drawback; they did not provide a constant input-impedance. Without good isolation, e.g., between stages of a wideband intermediate-frequency amplifier, there would be a reflection of this inherent variation in impedance which would produce undesirable effects. The required isolation can be readily obtained with electron tube circuits. However, the required isolation is not obtained when a direct substitution of transistors for tubes is made in prior-art limiter circuits. With the development of wider-band limiters to handle the present telephone, television and high speed data systems, the design of amplifiers to drive these limiters becomes very difficult. A constant-input limiter lessens the requirement for this driving source and reduces its complexity.

The principal object of this invention is, therefore, the provision of a limiter that presents nearly a constant load to the driving amplifier regardless of the amount of limiting that is taking place.

According to the invention, a limiter circuit is provided using a pair of diodes connected in series opposition between the source and load in combination with a pair of diodes connected in parallel opposition and connected in shunt across the source. At low level signals, the impedance of the shunt section of the limiter appears to be an open circuit to the source since the voltage is not sufficient to drive the diodes into conduction. At the same time the series diodes which are biased to conduction appear to be a small resistance in series with the load. As the signal level is raised, the shunt diodes begin to conduct, thus lowering the average effective resistance of the limiter circut as the voltage increases. However, at the same time the series diodes are driven into the non-conducting region, thus presenting a higher resistance in series with the source. As a result the resistance of the shunt diodes tends to lower the input impedance and the series diodes tend to compensate for the effect of the load by means of isolation.

The above-mentioned and other objects and features of this invention and the manner of attaining them will become more apparent, and the invention itself will be best understood, by reference to the following description of an embodiment of the invention taken in conjunction with the accompanying drawings comprising FIGS. 1–6 wherein.

Figure 1:
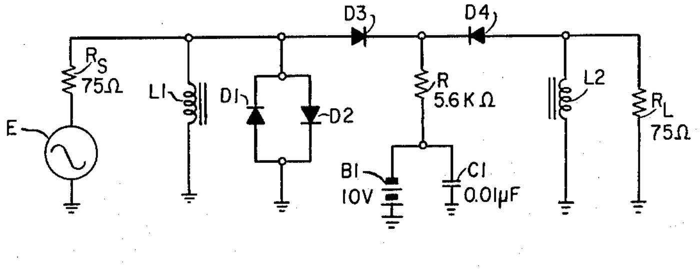
FIG. 1 is a schematic diagram of the limiter circuit.

Referring to FIG. 1, diodes D3 and D4 are connected in series opposition between source E and load $R_L$. Diodes D1 and D2 are connected in parallel and the combination is connected in shunt with source E. Resistor R is connected to the junction of the series diodes and provides biasing current to the series diodes from battery B1. Inductor L1 is connected across source E so that the current flowing from source E cannot change instantaneously which helps maintain a uniform impedance to source E when the diodes become conductive. Inductor L2 similarly is connected across the load R1 so that the current flowing to the load cannot change instantaneously which helps provide a uniform load current when the diodes become conductive. The preferred embodiment of this invention has been arranged to operate with an IF amplifier as the source and another IF amplifier as the load. The circuit has been constructed to operate with a peak source voltage of about 2.0 volts R.M.S. and maintain an output level constant within 0.1 db over a range of 50 to 90 mc.

Figure 2:
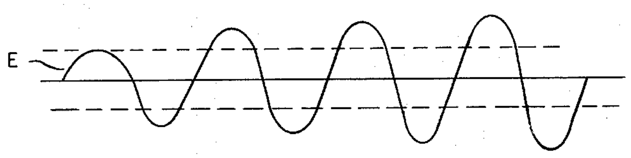
FIGS. 2–5 are graphs that are helpful in understanding the operation of the limiter circuit.
Figure 3:
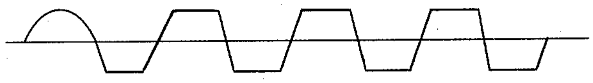

Series diodes D3 and D4 are biased to conduction by current through resistor R and inductors L1 and L2 respectively. As the instantaneous current rises from A.C. voltage source E as shown in FIG. 2, one of the diodes is driven into non-conduction when the instantaneous current becomes equal to the direct current. Current cannot flow in the reversed direction through the diode and is blocked from the load resistor $R_L$ for a portion of the wave form as shown in FIG. 3, which represents the current to the load. The effect of the operation of the series diodes is the increase of impedance as seen from voltage source E. When the input voltage is low, the load will be essentially the load $R_L$; however, as the voltage rises this load is seen for only a portion of the conducting periods of the two series diodes.

Figure 4:
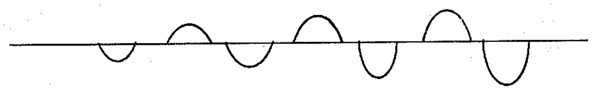
Figure 6:
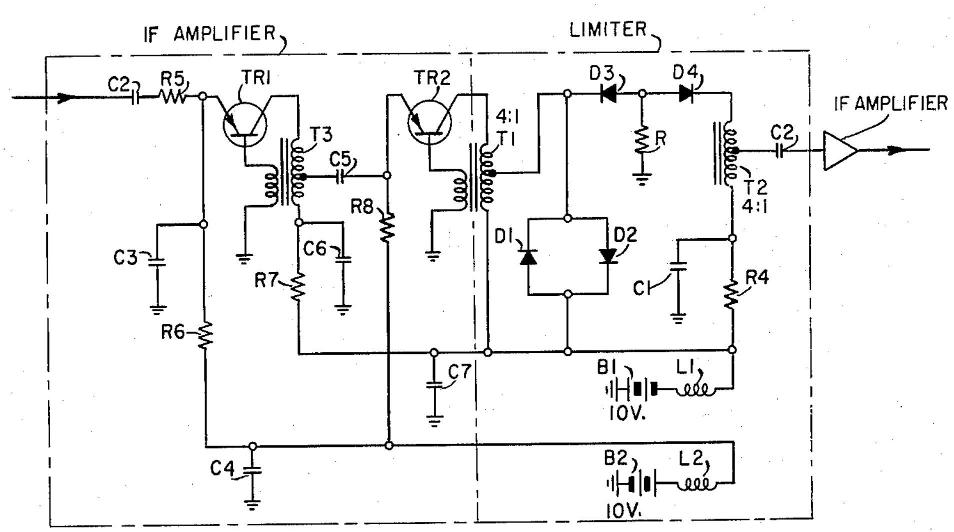
FIG. 6 is a schematic diagram of the limiter circuit incorporated in a system with intermediate-frequency amplifiers.

The use of a pair of shunt diodes D1 and D2 provides a path for the current flow when the series diodes are blocked. The current through the shunt diodes is shown in FIG. 4. As a result, the input impedance is prevented from rising as the signal increases. They also provide a lower impedance signal source to the series diodes since the parallel diodes are tending to short circuit the signal on the peak of the wave form. This lowering of the impedance makes the switching ability of the series diodes more effective.

Figure 5:
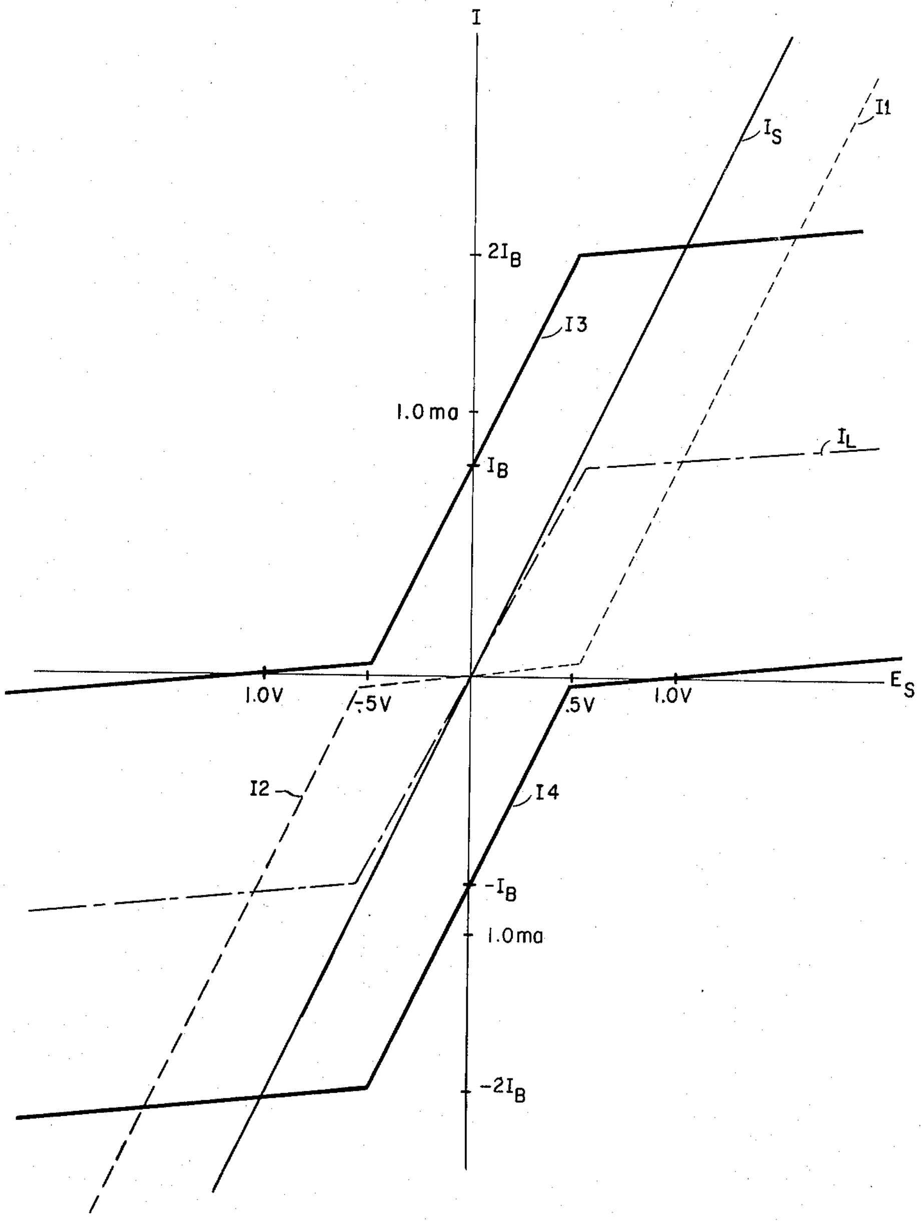

FIG. 5 is a graph of the source current $I_S$, load current IL, and current through the diodes, assuming ideal diode characteristics. The abscissa represents signal voltage $E_S$ which is measured across source E and source resistance $R_S$. The curve I3 represents current through diode D3 and, therefore, it is apparent that at 0 signal voltage a current $I_B$ flows through diode D3 in a circuit that includes inductor L1, diode D3, and resistor R. Note that $I_B$ flows through inductor 1 and not through diode D2 because diode D2 does not begin to conduct until the signal voltage $E_S$ reaches approximately 0.5 volts. Similarly, under the same conditions curve I4 indicates that a current $-I_B$ flows through diode D4 in a circuit that includes inductors L2, diode D4, and resistor R. As a result a bias current of $2I_B$ flows through resistor R to forward bias diodes D3 and D4.

As the signal voltage $E_S$ increases positively, current I3 increases and current I4 decreases negatively. Current I1 through diode D1 also increases but at a relatively slow rate. When voltage $E_S$ reaches the clipping level, current I4 is nearly zero. At this point diode D4 is in a state of non-conduction; however, load current IL remains substantially constant as current in inductor L2 cannot change instantaneously. Furthermore, shunt diode D1 reaches conduction and current I1 increases relatively fast with increasing signal voltage. Current I3 is equal to approximately $2I_B$ plus current I4. Source current $I_S$ continues to increase linearly and is approximately equal to I1 plus $2I_B$, neglecting the relatively small current I4.

In the reverse situation current I4 increases and current I3 decreases as signal voltage $E_S$ becomes negative. The source current and load current decrease linearly. When signal voltage $E_S$ reaches the clipping level, shunt diode D2 conducts and series diode D3 non-conducts. Current I2 increases relatively fast with increasing signal voltage. Current I3 is almost negligible and, therefore, current I4 remains constant at $-2I_B$ plus the small current I3. Load current IL remains at $-I_B$ as current cannot change instantaneously in inductor L2. However, source current $I_S$ continues to increase linearly with increasing signal voltage, because current $I_S$ is approximately equal to current I2 plus $2I_B$.

It is now readily apparent that a proper selection of characteristics for the series diodes and the shunt diodes allows the source current to continue increasing linearly even after the clipping voltage has been exceeded. Therefore, the limiter circuit appears to be a constant impedance to the source for all values of signal voltage.

Due to the frequency of operation the diodes must necessarily be very fast as, for example, Hughes HD-5001 silicon diodes (see Hughes, "Tentative Bulletin DS-87"). However, the increase in speed results in a diode that has a reasonably soft break point; that is, it does not go from conduction to non-conduction with a very sharp resistance characteristic. The speed at which it can sense changes, though, must be very fast, this being generally described as recovery time. Slow diodes would have the effect of appearing as resistors at high frequencies since the current storage time would be greater than the period of the wave form; that is, the diode would not have the capability of blocking the current in the reverse direction before the next flow of current in the conducting direction. The current flow should practically cease within a fraction of a nanosecond when the driving voltage is blocked.

The use of the shunt diodes are more practical for higher frequency limiters since the available high-speed diodes do not function well as switches. The shunt diodes, in a practical sense, decrease the transient time from conduction to non-conduction for the series diodes. This is accomplished by the decrease in source impedance as the switching point is reached.

A further advantage, and probably the most important with relation to wideband circuits using transistors, is in providing a reasonably constant impedance to the amplifier. If the load impedance of the amplifier changes with output level, the gain and response can be affected. And in the case of amplifiers driving limiters as shown in FIG. 5, this becomes quite a problem since the response up to the limiter may not be flat, thus these irregularities may reflect themselves as load impedance variations to the amplifier. This may then be a cause of AM-PM conversion in the amplifier itself rather than the limiter.

The load variations of the limiter amplifier may also be reflected through the amplifier to the input circuit which may be a highly selective filter whose termination impedance must be kept within 5 percent in order to achieve a response below 0.1 db across the band. Should the impedance of this amplifier change beyond these limits, the response could be distorted and the correction of this response by limiting action always causes some amount of AM-PM conversion.

Another consideration that makes limiter design using transistors difficult is the low peak voltage that one has available. A peak-to-peak voltage of 2 volts is very difficult to obtain and the breakdown voltage of high speed silicon diodes is about 0.5 v. or half of the peak voltage. The pair of shunt diodes increases the limiting or reduction of AM from about 20 to 30 db in a single stage. This increase could possibly be obtained with added drive power and proper design of a 2-diode limiter. The greater driving power is more expensive than the addition of the extra pair of diodes. This design would then require an amplifier that would operate independent of the load impedance.

While I have described above the principles of my invention in connection with specific apparatus, it is to be clearly understood that this description is made only by way of example and not as a limitation to the scope of my invention.

What is claimed is:

1. A limiter circuit comprising a source of alternating current signals;
 - a parallel pair of diodes connected in parallel opposition and in shunt across the source;
 - a series pair of semiconductor diodes connected serially and in series opposition between said parallel pair of diodes and a load;
 - a first inductor connected in shunt across the source for preventing inductance changes in current for the source;
 - a second inductance connected in shunt across the load for providing instantaneous changes in current to the load;
 - a direct-current biasing means for forward biasing both said series connected diodes;
 - so connected and arranged that in response to signals exceeding a threshold amplitude said series connected diodes are driven into non-conduction selectively on respective half cycles of the signals and at the same time upon a series connected diode becoming non-conductive the corresponding one of said parallel connected diodes is driven into conduction.

2. A limiter circuit as claimed in claim 1, wherein the characteristics of all said diodes and the value of bias current supplied by said biasing means determines an operating point on the series-diode characteristics such that the input impedance is substantially constant.

References Cited by the Examiner

UNITED STATES PATENTS

| | | | |
|---|---|---|---|
| 2,675,473 | 4/54 | Femmer | 328—171 |
| 2,964,650 | 12/60 | Radcliffe et al. | 307—88.5 |
| 2,976,430 | 3/61 | Sander | 328—171 X |
| 3,056,046 | 9/62 | Morgan | 307—88.5 |
| 3,162,817 | 12/64 | MacIntyre | 328—91 |

JOHN W. HUCKERT, *Primary Examiner.*

ARTHUR GAUSS, *Examiner.*